US010141042B1

(12) United States Patent
Richter (10) Patent No.: US 10,141,042 B1
(45) Date of Patent: Nov. 27, 2018

(54) METHOD AND APPARATUS FOR PRECHARGE AND REFRESH CONTROL

(71) Applicant: Micron Technology, Inc., Boise, ID (US)

(72) Inventor: Michael Richter, Ottobrunn (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/603,295

(22) Filed: May 23, 2017

(51) Int. Cl.
*G11C 7/00* (2006.01)
*G11C 11/406* (2006.01)
*G11C 11/4094* (2006.01)
*G11C 11/408* (2006.01)

(52) U.S. Cl.
CPC .... *G11C 11/40618* (2013.01); *G11C 11/4087* (2013.01); *G11C 11/4094* (2013.01)

(58) Field of Classification Search
CPC .......... G11C 11/4087; G11C 11/40618; G11C 11/408; G11C 16/08; G11C 8/06; G11C 8/10
See application file for complete search history.

(56) References Cited

U.S. PATENT DOCUMENTS

| | | | | |
|---|---|---|---|---|
| 5,471,430 A * | 11/1995 | Sawada | ................. | G11C 11/406 365/222 |
| 6,515,900 B2 * | 2/2003 | Kato | ..................... | G11C 16/08 365/185.11 |
| 6,931,479 B2 * | 8/2005 | Choi | ...................... | G11C 5/066 365/189.15 |
| 8,593,899 B2 * | 11/2013 | Ide | ......................... | G11C 5/025 365/174 |
| 2002/0018394 A1 * | 2/2002 | Takahashi | ................ | G11C 7/22 365/233.16 |
| 2005/0111282 A1 * | 5/2005 | Dono | ..................... | G11C 11/406 365/222 |
| 2006/0265556 A1 * | 11/2006 | Janzen | ................. | G11C 7/1072 711/154 |
| 2007/0121409 A1 | 5/2007 | Remaklus et al. | | |
| 2012/0079183 A1 | 3/2012 | Bains | | |
| 2013/0080694 A1 | 3/2013 | Iyer et al. | | |
| 2014/0133255 A1 | 5/2014 | Kajigaya | | |
| 2016/0254044 A1 | 9/2016 | Bains et al. | | |

OTHER PUBLICATIONS

JEDEC Standard: High Bandwidth Memory (HBM) DRAM; JESD235, JEDEC Solid State Technology Association; Published Nov. 2015, relevant pp. 30-32.
International Search Report and Written Opinion dated Jul. 19, 2018 for PCT Application No. PCT/US2018/025533, 16 pages.

* cited by examiner

*Primary Examiner* — Tuan T Nguyen
(74) *Attorney, Agent, or Firm* — Dorsey & Whitney LLP (57) ABSTRACT

Method and Apparatuses for transmitting and receiving commands for a semiconductor device are described. An example apparatus includes: a memory device including a plurality of banks, each bank including a plurality of memory cells; and a memory controller that transmits a first command and a plurality of address signals indicative of a memory cell in a first bank of the plurality of banks at a first time. The first command is indicative of performing a first memory operation, and a second memory operation different from the first memory operation. The memory device receives the first command and the plurality of address signals and further performs the second memory operation to the first bank responsive, at least a part, to the plurality of address signals and the first command.

11 Claims, 9 Drawing Sheets

FIG. 9

METHOD AND APPARATUS FOR PRECHARGE AND REFRESH CONTROL

BACKGROUND

High data reliability, high speed of memory access, and reduced chip size are features that are demanded from semiconductor memory.

In recent years, there has been an effort to increase access speed for semiconductor memory devices. For example, one bank of a multi-bank semiconductor memory device may be refreshed on a semiconductor memory device which supports a so-called per-bank refresh. With per-bank refresh, read or write accesses to the other banks of the memory array can continue while the one bank is being refreshed in the background. In order to initiate one refresh cycle of the memory array for refreshing a row, two commands are issued: at first, a precharge command is issued to close an open row in a bank. Once the row has been precharged, a per-bank refresh command would be issued to perform the refresh in the bank. However, the precharge and per-bank refresh commands occupy two command slots on the command bus, resulting in causing reduction of the average memory bandwidth.

Figure 1A:
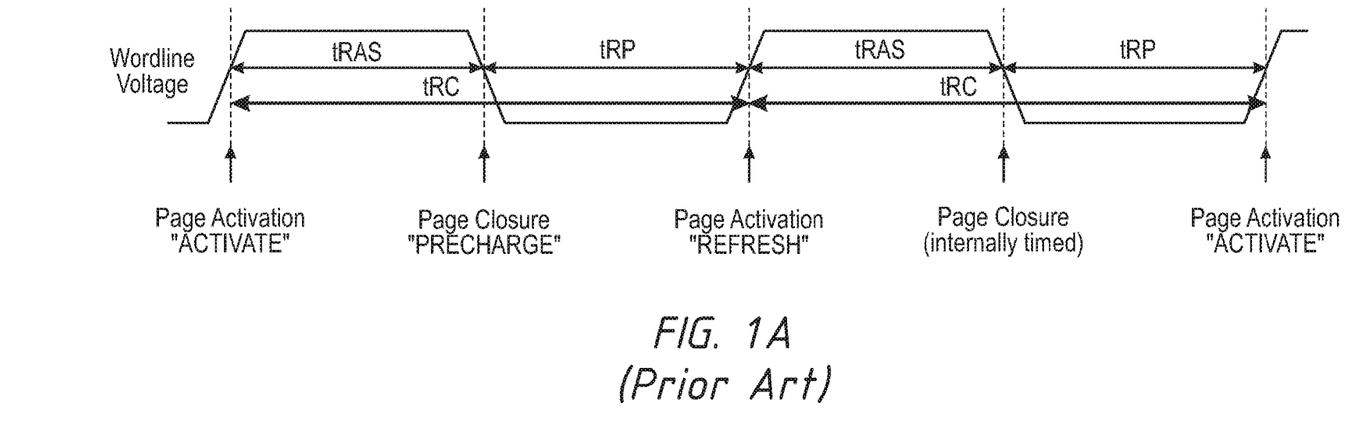
FIG. 1A is a timing diagram of a voltage of a word line associated with a memory row access in a conventional semiconductor memory device.
Figure 1B:
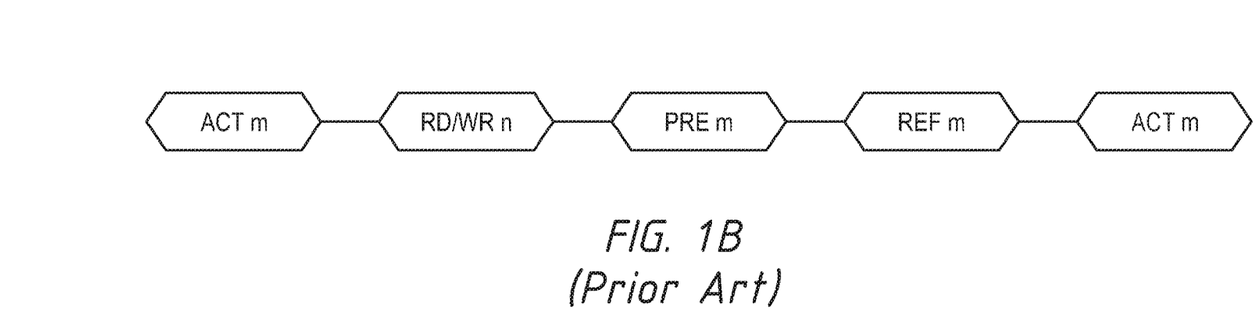
FIG. 1B is a flow diagram of a command sequence for a per-bank refresh cycle in the conventional semiconductor memory device.

FIG. 1A is a timing diagram of a voltage of a word line associated with a memory row access in a conventional semiconductor memory device. The word line is set to a logic high level responsive to a row activation command (e.g., an activation command "ACTIVATE", or a per-bank refresh command "REFRESH"), in order to select a page to be opened. The page is open responsive to the activation command, and a read or write access to the page occurs responsive to a read or write command, or a refresh operation of the row in a bank is performed responsive to the per-bank refresh command. If either a different page in the bank is to be opened, or a row in the bank is to be refreshed, and provided the minimum row access cycle time tRAS (e.g., a period between a row access command and row restore) has been met, a precharge command is issued to the bank, and the word line voltage is set to a logic low level. Once the minimum row precharge time tRP has been met, the word line voltage is set to the logic high level again responsive to the per-bank refresh command and the row address may be provided from a refresh counter. Once the tRAS has been met and the page has been refreshed, the word line is set to the logic low level again. In this example, a row cycle time tRC, (e.g., a period of waiting time after a row is activated in a bank before another row can be activated in the same bank, tRAS+tRP) is the same for an activation-precharge cycle as for the per-bank refresh cycle. FIG. 1B is a flow diagram of a command sequence for a per-bank refresh cycle in the conventional semiconductor memory device. The per-bank refresh operation for bank m after accessing column n for read or write (RD/WR m) uses two commands, a precharge command to close the open page, and a per-bank refresh command.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 2:
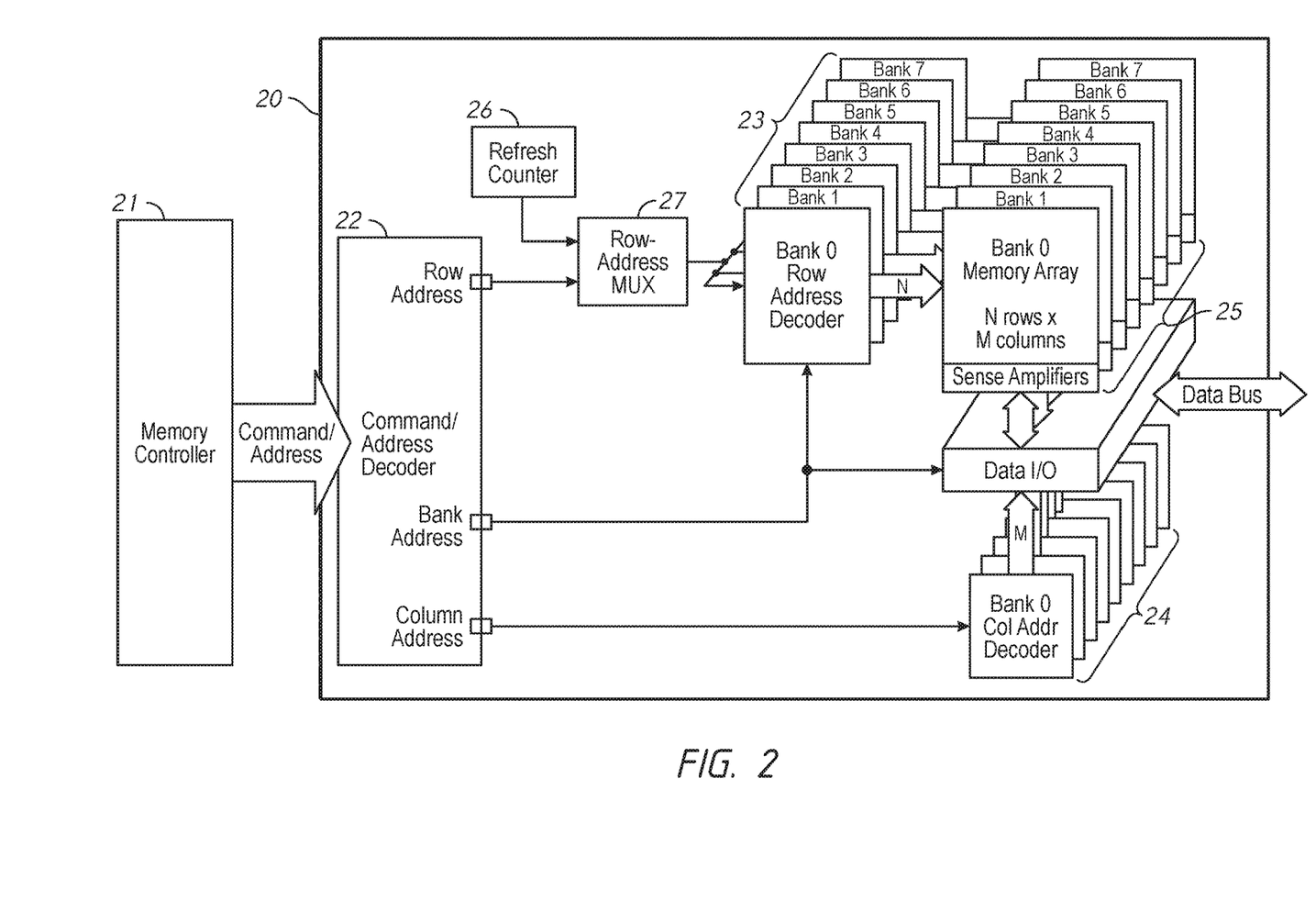
FIG. 2 is a block diagram of a semiconductor memory device in accordance with some embodiments of the present disclosure.

In a semiconductor memory device, such as dynamic random access memory (DRAM), memory cells are refreshed in order to preserve the stored data. FIG. 2 is a block diagram of a semiconductor memory device 20 in accordance with some embodiments of the present disclosure. For example, the semiconductor memory device 20 may include a memory array 25 divided into a plurality of banks (e.g., eight banks), each bank having N rows and M columns, where N and M are natural numbers. For a regular read or write access, the bank, row and column addresses are provided by a memory controller 21. The semiconductor memory device 20 may include a command/address decoder 22 that may receive a command (e.g., read, write, etc.) including address information from the memory controller 21 and provide a row address, a bank address and a column address. The semiconductor memory device 20 may include a row address decoder 23 and a column address decoder 24 that may receive the row address and the column address, respectively. The row address decoder 23 and the column address decoder 24 may also receive the bank address. The row address decoder 23 may select the bank and row to be opened for a further read or write access. The column decoder 24 may select the bank and column to be accessed with read or write operations.

In case of a per-bank refresh, the row address generated based on a refresh counter 26 may be used as a row address to select a row to be refreshed. A row address multiplexer 27 may receive the row address from the memory controller 21 via the command address decoder 22 and the row address from the refresh counter 26. The row address multiplexer 27 selectively provides the row address from the memory controller 21 or the row address from the refresh counter 26, responsive to a command for a normal operation (e.g., read, write, row-address level refresh) or a command for the per-bank refresh operation. For the per-bank refresh operation the bank address is provided by the memory controller 21. The row address decoder 23 thus selects the bank responsive to the bank address provided from the memory controller 21 and further selects a row to be refreshed in the selected bank responsive to the row address provided from the refresh counter 26.

Figure 3:
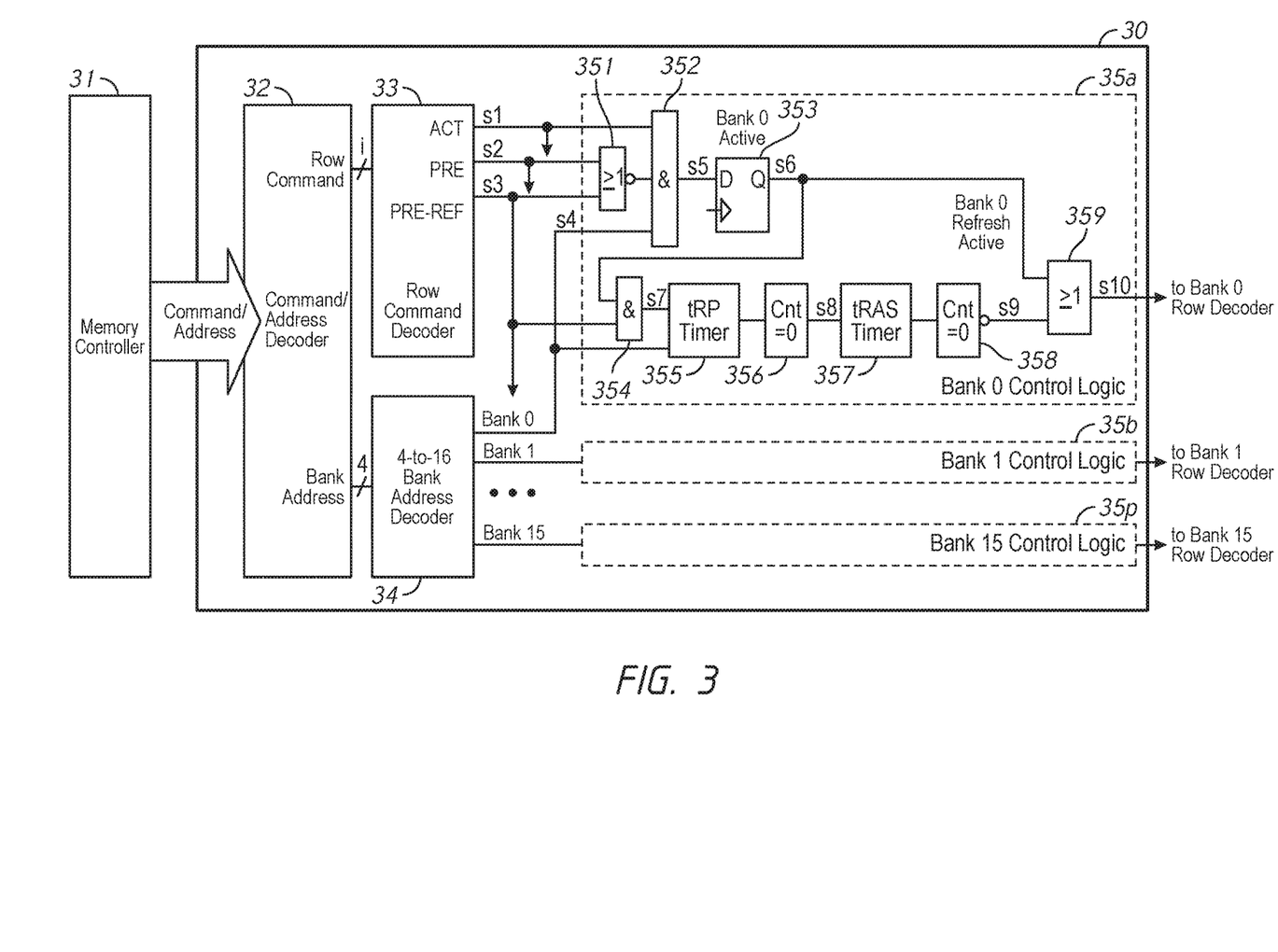
FIG. 3 is a block diagram of bank control logic circuits in the semiconductor memory device in accordance with some embodiments of the present disclosure.

FIG. 3 is a block diagram of bank control logic circuits in a semiconductor memory device 30 in accordance with some embodiments of the present disclosure. For example, the semiconductor memory device 30 may be the semiconductor memory device 20 in FIG. 2. For example, a memory controller 31 may be the memory controller 21 in FIG. 2. The memory controller 31 may provide a command and an address to a command/address decoder 32 in the semiconductor memory device 30, including a row access command. For example, the command/address decoder 32 may be the command/address decoder 22 in FIG. 2. The command/address decoder 32 may receive commands, addresses including a row address, a column address and a bank address. The command/address decoder 32 may provide a row access command among the commands to a row command decoder 33 and the bank address among the addresses to a bank address decoder 34. The row command decoder 33 may determine whether the row access command is either ACTIVATE (ACT) to open a row in a bank, PRECHARGE (PRE) to close an open row in the bank, or a combined PRECHARGE-REFRESH (PRE-REF) command to close an open row in the bank followed by a refresh operation on the same bank. For example, the row command decoder 33 may activate either one of command output nodes ACT, PRE, PRE-REF responsive to the determined command, ACT, PRE, or PRE-REF. For example, the bank address may be provided by the command/address decoder 32 in a plurality of bits (e.g., four), and the bank address decoder 34 may provide a bank selection signal to one bank among a plurality of banks (e.g., sixteen banks).

For each bank, a bank control logic circuit 35 may be provided. For example, the semiconductor memory device 30 may include Bank 0 control logic circuit 35*a*, Bank 1 control logic circuit 35*b*, . . . Bank 15 control logic circuit 35*p*. Each bank control logic circuit 35 may include input nodes s1 to s4. For example, the input nodes s1, s2 and s3 of each bank control logic circuit 35 may be coupled to the command output nodes for the ACT, PRE, and PRE-REF of the row command decoder 33, respectively. The input node s4 of each bank control logic circuit 35 may receive the bank selection signal for the corresponding bank from the bank address decoder 34.

A state of each bank (open or closed) may be stored individually in a "Bank n Active" latch or flag 353 that may be provided for each bank. For example, each bank control logic circuit 35 may include an AND logic circuit 352 that may provide a signal on s5 node to set a "Bank n Active" flag signal on an output node s6 from a flip flop 353 that may function as a bank active status circuit, when bank n is selected by the input node s4 in an active state along with the input s1 in an active state by the ACT command. The AND logic circuit 352 may reset the "Bank n Active" flag signal on the output node s6 when bank n is selected by the input node s4 in an active state along with either the input node s2 in an active state by a PRE command or the input node s3 in an active state by a PRE-REF command; a NOR logic circuit 351 may provide an inverted signal to the AND logic circuit 352. Thus, the flip flop 353 may provide the bank n active flag signal on the output node s6. For example, the bank n active flag signal in an active state on the output node s6 may indicate that bank n is active (bank n is selected and activated) whereas the bank n active flag signal in an inactive state on the output node s6 may indicate that either bank n is not in active or bank n is subject to precharge, etc.

Each bank control logic circuit 35 may include a precharge timer 355 to delay the row activation of a refresh operation in case of a precharge-refresh command to an open bank. For example, each bank control logic circuit 35 may include an AND logic circuit 354 that may provide an active signal on s7 node to set the precharge timer 355, when the bank is active as indicated by the active bank n active flag signal on s6 node along with the input node s3 is in an active state by the PRE-REF command. The precharge timer 355 may provide a counter value to a count determiner 356 when bank n is selected along with the active signal on s7 node. For example, the precharge timer 355 may be a digital countdown counter. The precharge timer 355 may be a programmable counter. Alternatively, the precharge timer 355 could be an analog timer. The time tRP has elapsed when the counter value of the precharge timer 355 reaches 0 and the count determiner 356 may provide an active signal on s8 node coupled to an input node of a RAS timer (tRAS timer) 357.

The RAS timer 357 may generate a pulse equivalent to the minimum row active time responsive to the active signal on s8 node by providing a counter value to a count determiner 358. For example, the RAS timer 357 may be a digital countdown counter. The RAS timer 357 may be a programmable counter. Alternatively, the RAS timer 357 could be an analog timer. The count determiner 358 may provide an active signal on s9 node coupled to an input node of an OR logic circuit 359, which is a bank row activation circuit, when the time tRAS has elapsed and the counter value of the tRAS timer 357 reaches 0.

The OR logic circuit 359 may receive the bank n active flag signal on the output node s6 and the signal on the s9 node. The bank n active flag signal on the s6 node may indicate whether bank n refresh operation is active and the signal on the s9 node may indicate whether the time tRAS has elapsed. The OR logic circuit 359 may provide a bank row activation signal on s10 node that is coupled to bank n row decoder where bank n to be opened is selected based on the row address. The bank row activation signal on s10 node may be active either when an ACT command was received and row access has been executed, or during the refresh operation.

Figure 4:
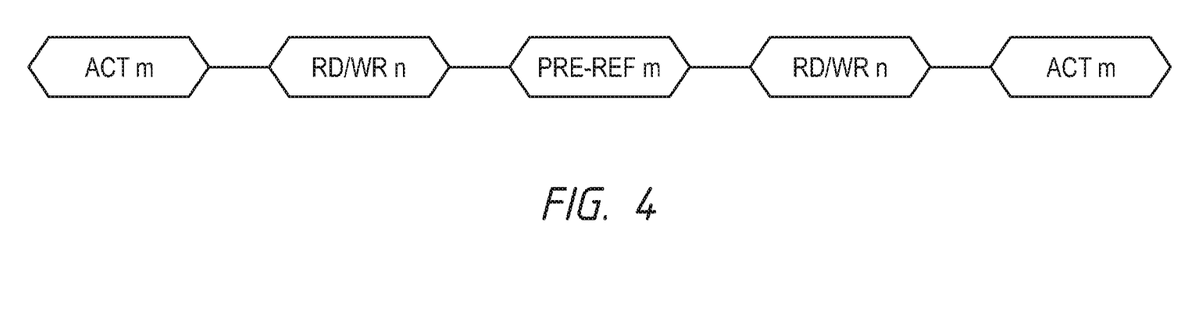
FIG. 4 is a flow diagram of a command sequence a per-bank refresh cycle in a semiconductor memory device in accordance with some embodiments of the present disclosure.

FIG. 4 is a flow diagram of a command sequence including a per-bank refresh cycle in a semiconductor memory device in accordance with some embodiments of the present disclosure. For example, the semiconductor memory device may be the semiconductor memory device 30 in FIG. 3. The semiconductor memory device may be provided with a command set including a "PRECHARGE-REFRESH (PRE- REF)" command. For example, PRE-REF m command instructs a combination of a precharge operation and a refresh operation for bank m. For example, the semiconductor memory device may schedule a combination of row precharge and refresh operations for bank m, responsive to a single, combined PRE-REF command for bank m. A memory controller that may provide commands to the semiconductor memory device may use a command slot that becomes available following the PRE-REF command for providing an access command (e.g., read, write, etc.) for bank n that is different from bank m. Thus, more commands may be transmitted and memory access operations may be executed on the semiconductor memory device with multi-banks within a same time period. For example, in the command sequence as shown in FIG. 4, the memory controller may issue or provide five commands in sequence, which include an ACT m command to select or open a row of the bank m, a RD/WR n command to perform a read or write access to the bank n that has already been opened by the previous ACT n command, a PRE-REF m command to close the open row of the bank m and then initiate a refresh operation on the bank m, another RD/WR n command to perform a read or write access to another row of the bank n, and an ACT m command to select or open a row of the bank m for performing a read or write access to the bank m.

Figure 5:
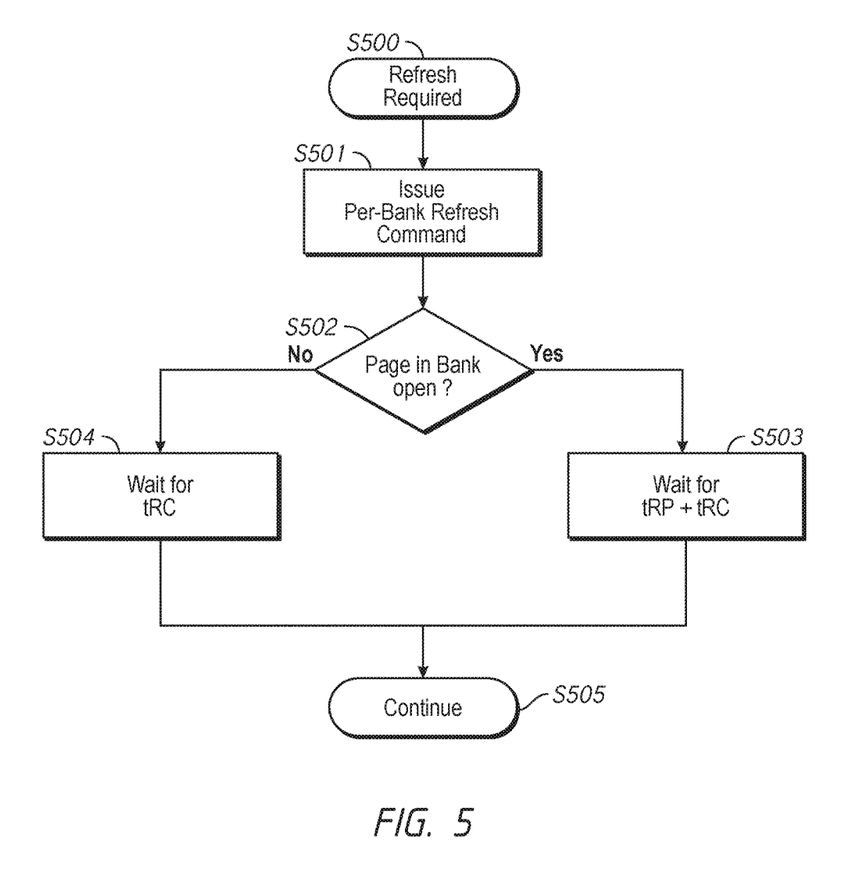
FIG. 5 is a flow diagram of an operation related to a per-bank precharge and refresh operation by a memory controller in accordance with some embodiments of the present disclosure.

FIG. 5 is a flow diagram of an operation related to a per-bank precharge and refresh operation by a memory controller in accordance with some embodiments of the present disclosure. For example, the memory controller may be the memory controller 31 in FIG. 3. Once the memory controller determines that a bank is to be refreshed (S500), the memory controller may issue a per-bank refresh command (S501) accompanied by a bank address to be refreshed to a semiconductor memory device that may be the semiconductor memory device 20 of FIG. 2 or 30 of FIG. 3, and then may check a status of a page (or a row) in the bank, whether the page is open (S501). For this purpose, although not shown in FIG. 3, the memory controller 31 may have a plurality of bank status registers corresponding respectively to a plurality of banks provided in the semiconductor memory device. Each register of the registers may store information indicating whether any page of the bank to be refreshed is open. If no page in the bank is open, the memory controller may wait for the row cycle time tRC (S504) until the refresh operation has been completed by the semiconductor memory device coupled to the memory controller. If, on the other hand, any page in the bank is open, the memory controller may wait for (tRP+tRC) (S503). After the step S504 or S503, the memory controller may proceed with succeeding operations (S505).

Figure 6:
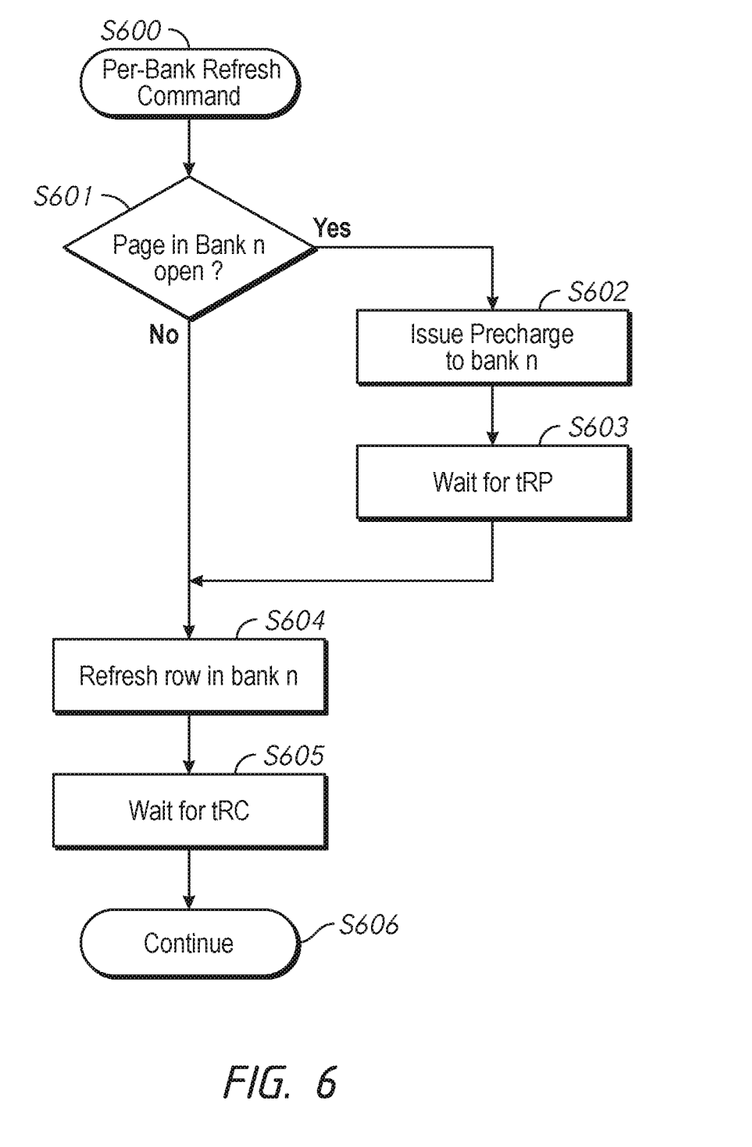
FIG. 6 is a flow diagram of an operation related to a per-bank precharge and refresh operation by a semiconductor memory device in accordance with some embodiments of the present disclosure.

FIG. 6 is a flow diagram of an operation related to a per-bank precharge and refresh operation caused by a per-bank refresh command in a semiconductor memory device in accordance with some embodiments of the present disclosure. For example, the semiconductor memory device may be the semiconductor memory device 20 of FIG. 2 or 30 of FIG. 3. The semiconductor memory device may receive commands, including a per-bank refresh command, issued by a memory controller (e.g., the memory controller that performs steps in FIG. 5). Once the semiconductor memory device receives the per-bank refresh command (S600) accompanied by a bank address, the semiconductor memory device may check a status of a page (or a row) in bank n selected by the bank address whether any page is open (S601). If no page in the bank n is open, the semiconductor memory device may disable a row precharge operation (as shown in S602 to S603) and may directly proceed to executing a refresh operation to a row selected by a refresh counter (that may be the refresh counter 26 of FIG. 2) in bank n (S604) and wait for tRC (S605) until the refresh operation has been completed. If, on the other hand, any page in bank n is open, the semiconductor memory device may internally execute the row precharge operation (S602) with closing an open page, wait for tRP (S603), and then may execute the refresh operation to the row (or page) selected by refresh counter in bank n (S604). The tRP waiting time may be determined either by an analog delay circuit or by a digital counter. Thus, in both cases one per-bank refresh command is being received and processed. The semiconductor memory device may determine whether the precharge operation may be executed based on the status of the bank.

Figure 8:
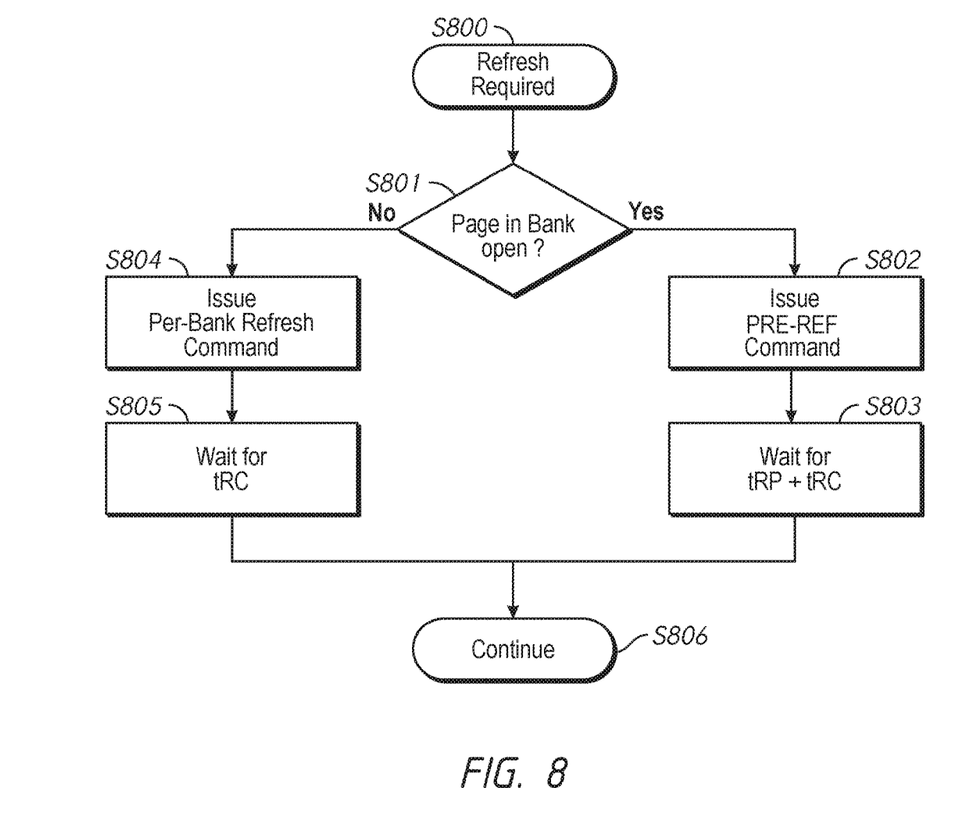
FIG. 8 is a flow diagram of an operation related to a per-bank precharge and refresh operation by a memory controller in accordance with some embodiments of the present disclosure.
Figure 9:
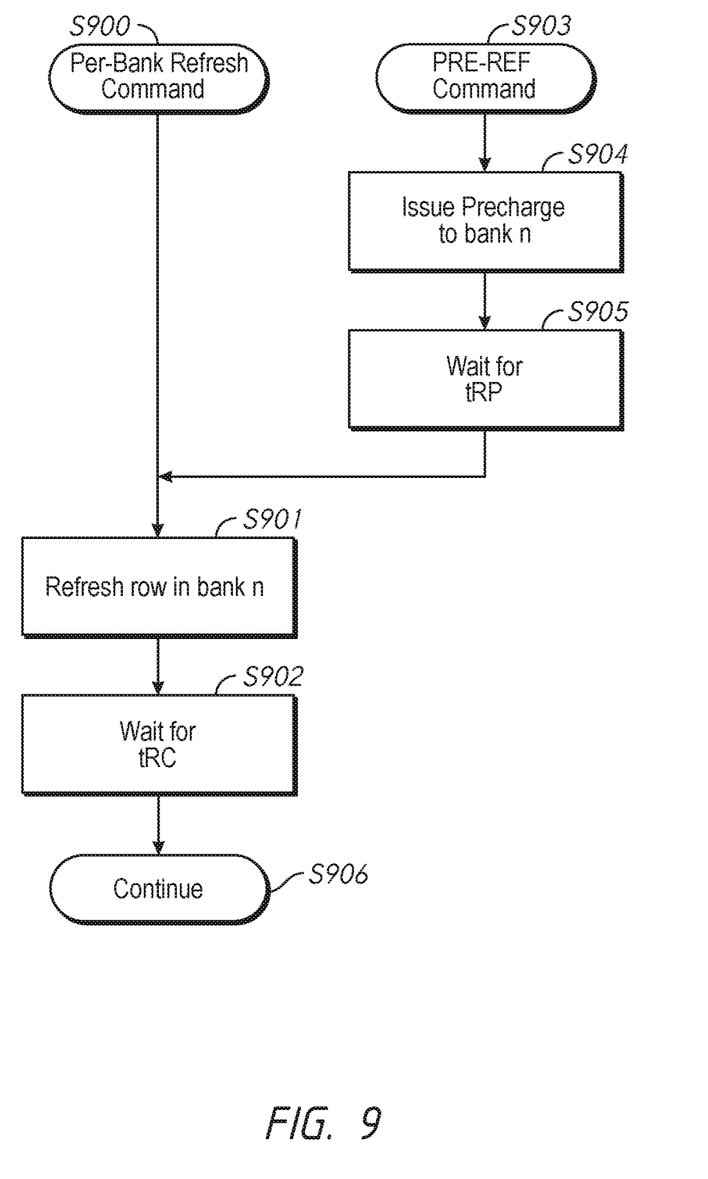
FIG. 9 is a flow diagram of an operation related to a per-bank precharge and refresh operation by a semiconductor memory device in accordance with some embodiments of the present disclosure.

In FIGS. 5 and 6, a per-bank refresh command is used as one per-bank precharge and refresh command. Alternatively, the memory controller and the semiconductor memory device may communicate using two different commands, a per-bank refresh command and a combined per-bank precharge-and-refresh command that is a PRE-REF command. For example, when determining whether a bank is to be refreshed (S800) as shown in FIG. 8, the memory controller may check a status of a page (or a row) in a bank to be refreshed whether the page is open (S801) and then issue the per-bank refresh command when no page in the bank is open. The memory controller may wait for tRC. As shown in FIG. 9, on the other hand, the semiconductor memory device may execute the per-bank refresh operation responsive to the per-bank refresh command (S900 and S901) and then wait for tRC (S902). Turning to FIG. 8, the memory controller may issue the PRE-REF command that is a combined per-bank precharge-and-refresh command (S802) when a page in the bank is open and then wait for a sum of tRP and tRC (S803). As shown in FIG. 9, the PRE-REF command (S903) may cause the semiconductor memory device to execute a precharge operation (S904) followed by the per-bank refresh operation (S901) after tRP (S905). If these two commands encoding is implemented, the semiconductor memory device may not execute a step (e.g., S601 in FIG. 6) of checking the status check of the bank.

Figure 7:
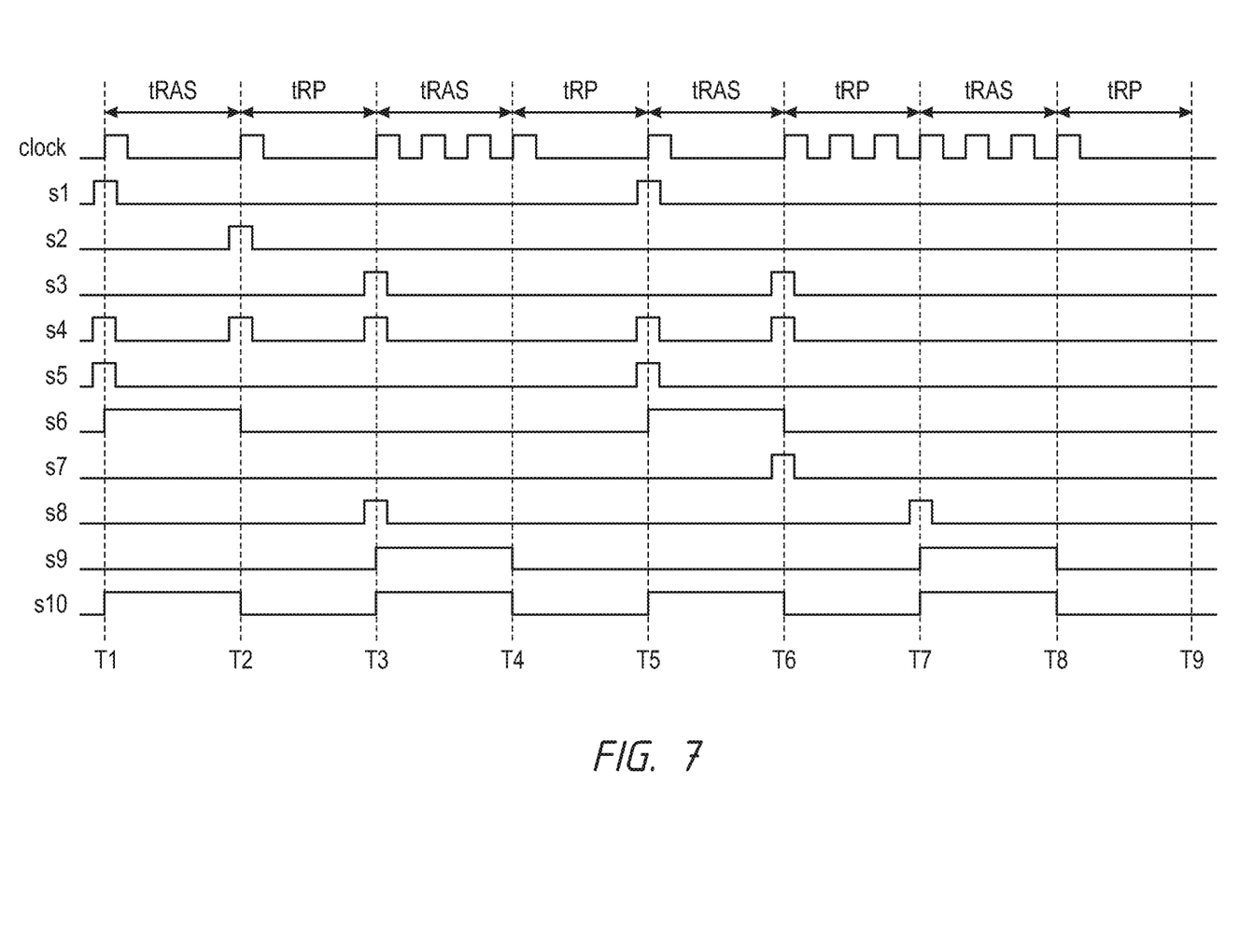
FIG. 7 is a timing diagram of signals around the bank control logic circuits of FIG. 3 in accordance with some embodiments of the present disclosure.

FIG. 7 is a timing diagram of signals around the bank control logic circuits of FIG. 3 in accordance with some embodiments of the present disclosure. For example, the memory controller 31 may provide a first command that is a row activation command ACT for a row in bank 0. The command/address decoder 32 may provide the first command to the row command decoder 33 and may provide a bank address associated with bank 0 to the bank address decoder 34. The row command decoder 33 may decode the first command as the row activation command ACT and may provide a pulse signal in an active state at time T1 on the input node s1 to bank control logic circuits 35a to 35p. The bank address decoder 34 may decode 4-bit bank address signals to obtain bank 0 and may provide a bank selection signal that is a pulse signal in an active state at time T1 on the input node s4 of the bank 0 control logic circuit 35a. Based on the active signals on the s1 and s4 nodes, the AND logic circuit 352 may provide an active pulse signal (e.g., a logic high level) at time T1 on the s5 node. The flip flop 353 may latch the active pulse signal on the s5 node with a clock edge at time T1 and may set a bank 0 active flag signal s6 to an active state (e.g., a logic high level) to indicate that bank 0 is in an active state. Thus, the OR logic circuit 359 may provide the bank row activation signal in an active state at time T1 on the s10 node that is coupled to a row decoder for bank 0 to activate the row selected by the row activation command ACT.

The memory controller 31 may provide a second command that is a precharge command PRE for a row in bank 0 at time T2 that is at least the minimum row access cycle time tRAS later than time T1. The command/address decoder 32 may provide the second command to the row command decoder 33 and may provide the bank address associated with bank 0 to the bank address decoder 34. The row command decoder 33 may decode the second command as the precharge command PRE and may provide a pulse signal in an active state at time T2 on the input node s2 to the bank control logic circuits 35a to 35p. The bank address decoder 34 may decode 4-bit bank address signals to obtain bank 0 and may provide a bank selection signal that is a pulse signal in an active state at time T2 on the input node s4 of the bank 0 control logic circuit 35a. Based on the active signals on the s2 and s4 nodes, the AND logic circuit 352 may provide an inactive signal (e.g., a logic low level) at T2 on the s5 node. The flip flop 353 may latch the inactive signal on the s5 node with a clock edge at T2 and may reset a bank 0 active flag signal s6 to an inactive state (e.g., a logic low level) to indicate that bank 0 is in an inactive state (e.g., idle or bank closed). Thus, the OR logic circuit 359 may provide the bank row activation signal in an inactive state at T2 on the s10 node that is coupled to the row decoder for bank 0 to deactivate the row selected by the precharge command PRE.

The memory controller 31 may provide a third command that is a precharge-refresh command PRE-REF for rows in bank 0 at time T3 that is at least the minimum row precharge time tRP later than time T2. The command/address decoder 32 may provide the third command to the row command decoder 33 and may provide the bank address associated with bank 0 to the bank address decoder 34. The row command decoder 33 may decode the third command as the precharge-refresh command PRE-REF and may provide a pulse signal in an active state at time T3 on the input node s3 to the bank control logic circuits 35a to 35p. The bank address decoder 34 may decode 4-bit bank address signals to obtain bank 0 and may provide a bank selection signal that is a pulse signal in an active state at time T3 on the input node s4 of the bank 0 control logic circuit 35a. Based on the active signals on the s3 and s4 nodes, the AND logic circuit 352 may provide an inactive signal (e.g., a logic low level) at time T3 on the s5 node. The flip flop 353 may latch the inactive signal on the s5 node with a clock edge at time T3 and may keep the bank 0 active flag signal s6 to the inactive state (e.g., the logic low level) to indicate that bank 0 is still in the inactive state (e.g., idle or bank closed). Thus, a signal on the s7 node is still inactive and the RP timer 355 for bank 0 may not be started. The counter value of the RP timer 355 is still 0 and the count determiner 356 may provide an active signal on s8 node coupled to the input node of the RAS timer 357. Thus, the RAS timer 357 may be triggered to provide an active signal (e.g., a logic high level) on the s9 node and the OR logic circuit 359 may provide a bank row activation signal in an active state (e.g., a logic high level) on the s10 node at time T3 for the minimum row access cycle time tRAS.

The memory controller 31 may provide no row command at time T4 that is at least the minimum row access cycle time tRAS later than time T3. The counter value of the RAS timer 357 may be at zero and the RAS timer 357 may provide an inactive signal (e.g., a logic low level) on the s9 node and the OR logic circuit 359 may provide the bank row activation signal in an inactive state (e.g., a logic low level) on the s10 node at time T4 indicative of closing bank 0.

The memory controller 31 may provide a fourth command that is a row activation command ACT for a row in bank 0 again at time T5 to activate bank 0 which may set the bank 0 active flag signal s6 to the active state.

The memory controller 31 may provide a fifth command that is a precharge-refresh command PRE-REF for rows in bank 0 at time T6 that is at least the minimum row access cycle time tRAS later than time T5. The command/address decoder 32 may provide the fifth command to the row command decoder 33 and may provide the bank address associated with bank 0 to the bank address decoder 34. The row command decoder 33 may decode the fifth command as the precharge-refresh command PRE-REF and may provide a pulse signal in an active state at time T6 on the input node s3 to the bank control logic circuits 35a to 35p. The bank address decoder 34 may decode 4-bit bank address signals to obtain bank 0 and may provide a bank selection signal that is a pulse signal in an active state at time T6 on the input node s4 of bank 0 control logic circuit 35a. Because the memory controller 31 provides the precharge-refresh command PRE-REF at time T6 immediately after providing the row activation command ACT at time T5, the bank 0 active flag signal s6 has been set to the active state while the s3 signal is also activated at time T6, and the RP timer 355 may start counting down responsive to the signal on the s7 node at time T6. Based on the active signals on the s3 and s4 nodes, the AND logic circuit 352 may provide the inactive signal (e.g., the logic low level) at time T6 on the s5 node. The flip flop 353 may latch the inactive signal on the s5 node with a clock edge at time T6 and may keep the bank 0 active flag signal s6 to the inactive state (e.g., the logic low level) to indicate that bank 0 is still in the inactive state (e.g., idle or bank closed). Thus, the OR logic circuit 359 may provide the bank row activation signal in the inactive state at T6 on the s10 node that is coupled to the row decoder for bank 0 to deactivate the row selected by the precharge-refresh command PRE-REF. The tRP timer 355 may have a counter value down to zero and the count determiner 356 may provide an active signal on s8 node coupled to the input node of the RAS timer 357 at time T7. Thus, the RAS timer 357 may be triggered to provide the active signal (e.g., the logic high level) on the s9 node and the OR logic circuit 359 may provide the bank row activation signal in the active state (e.g., the logic high level) on the s10 node at time T7 for the minimum row access cycle time tRAS.

The memory controller 31 may provide no row command at time T8 that is at least the minimum row access cycle time tRAS later than time T7. The counter value of the RAS timer 357 may be at zero and the RAS timer 357 may provide an inactive signal (e.g., a logic low level) on the s9 node and the OR logic circuit 359 may provide the bank row activation signal in the inactive state (e.g., the logic low level) on the s10 node at time T8 indicative of closing bank 0. The memory controller 31 may have to wait until time T9, when tRP has elapsed before opening another row in bank 0.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus, comprising:
a command decoder configured to receive a first command and a second command, and further configured to provide a first control signal and a second control signal responsive to the first command and the second command, respectively;
an address decoder configured to receive at least a portion of address signals and further configured to activate one bank selection signal of a plurality of bank selection signals corresponding to a plurality of banks, responsive to the at least a portion of address signals; and
a plurality of control logic circuits, wherein each control logic circuit of the plurality of control logic circuits is configured to receive the first control signal, the second control signal and a corresponding bank selection signal of the plurality of bank selection signals,
wherein the first command is indicative of performing a first memory operation for a first bank of the plurality of banks identified by the at least a portion of address signals, and the second command is indicative of performing the first memory operation and a second memory operation different from the first memory operation for the first bank of the plurality of banks, and
wherein a control logic circuit of the plurality of control logic circuits corresponding to the first bank is configured to provide a bank row activation signal to the first bank responsive to the bank selection signal corresponding to the first bank and the second control signal in the second memory operation.

2. The apparatus of claim 1, wherein the first memory operation is a precharge operation and the second memory operation is a refresh operation.

3. The apparatus of claim 2, wherein the control logic circuit of the plurality of control logic circuits comprises:
a bank active status circuit configured to provide a bank status flag signal indicative of whether the corresponding bank is in an active state; and
a bank row activation circuit configured to provide the bank row activation signal responsive, at least in part, to the bank status flag signal, and
wherein the bank row activation circuit is configured to provide the bank row activation signal in an active state responsive to the bank status flag signal in an active state, and further configured to provide the bank row activation signal in an inactive state responsive to the bank status flag signal in an inactive state.

4. The apparatus of claim 3, wherein the control logic circuit of the plurality of control logic circuits comprises a row access cycle timer configured to count a row access cycle time and further configured to provide a time up signal, and
wherein the bank row activation circuit is configured to provide the bank row activation signal in an inactive state responsive, at least in part, to the time up signal.

5. The apparatus of claim 4, wherein the control logic circuit of the plurality of control logic circuits further comprises a precharge timer configured to count a precharge time and further configured to provide a precharge time up signal after counting the precharge time responsive, at least in part, to the bank status flag signal and the bank selection signal, and
wherein the row access cycle timer is configured to count the row access cycle time, at least in part, to the precharge time up signal.

6. The apparatus of claim 5, wherein the precharge timer is configured to disable counting the precharge time responsive, at least in part, to the bank status flag signal in an inactive state.

7. The apparatus of claim 6, wherein at least one of the refresh timer and the precharge timer is a digital countdown-counter.

8. The apparatus of claim 6, wherein at least one of the refresh timer and the precharge timer is a programmable counter.

9. The apparatus of claim 6, wherein at least one of the refresh timer and the precharge timer is an analog timer.

10. The apparatus of claim 1, wherein the plurality of control logic circuits are configured to determine whether the first bank is in the active state responsive to the first command, and further configured to perform the first memory operation before performing the second memory operation for the first bank if the first bank is in the active state.

11. The apparatus of claim 10, wherein the plurality of control logic circuits is further configured to perform the first memory operation before second memory operation to the first bank responsive to the first command, and
wherein the memory device is configured to perform the second memory operation responsive to the second command.

* * * * *